United States Patent
Mietta et al.

(10) Patent No.: US 9,131,315 B2
(45) Date of Patent: Sep. 8, 2015

(54) MEMS MICROPHONE WITH A BUILT-IN TEXTILE MATERIAL PROTECTING SCREEN

(75) Inventors: Marco Mietta, Appiano Gentile (IT); Paolo Canonico, Appiano Gentile (IT)

(73) Assignee: SAATI S.P.A., Appiano Gentile (CO) (IT)

(*) Notice: Subject to any disclaimer, the term of this patent is extended or adjusted under 35 U.S.C. 154(b) by 0 days.

(21) Appl. No.: 13/603,121

(22) Filed: Sep. 4, 2012

(65) Prior Publication Data
US 2013/0058509 A1     Mar. 7, 2013

(30) Foreign Application Priority Data
Sep. 2, 2011    (IT) .................... MI11A1579

(51) Int. Cl.
- H04R 25/00   (2006.01)
- H04R 19/04   (2006.01)
- H04R 1/08    (2006.01)
- H04R 19/00   (2006.01)

(52) U.S. Cl.
CPC ............. H04R 19/04 (2013.01); H04R 1/086 (2013.01); H04R 19/005 (2013.01); *B81C 2203/0136* (2013.01)

(58) Field of Classification Search
CPC .... H04R 1/086; H04R 19/04; B81C 1/00269; B81C 2203/0136; B81C 2203/019
USPC .......... 381/150, 174, 189, 355, 369; 257/414–416; 438/50, 51, 53
See application file for complete search history.

(56) References Cited

U.S. PATENT DOCUMENTS

2007/0165896 A1 *  7/2007  Miles et al. ............... 381/356
2009/0268928 A1 * 10/2009  Ikeyama et al. ............ 381/150

FOREIGN PATENT DOCUMENTS

EP    1784046 A2 *  5/2007

* cited by examiner

*Primary Examiner* — Matthew Eason
(74) *Attorney, Agent, or Firm* — Hedman & Costigan, P.C.; James V. Costigan; Kathleen A. Costigan

(57) ABSTRACT

A MEMS microphone with a built-in textile material protecting screen comprises a microphone body having an opening thereat is arranged a textile material protecting screen which is built-in in the microphone body, during the production phase of the MEMS device called "packaging".

6 Claims, 1 Drawing Sheet

MEMS MICROPHONE WITH A BUILT-IN TEXTILE MATERIAL PROTECTING SCREEN

BACKGROUND OF THE INVENTION

The present invention relates to a MEMS microphone with a built-in textile material protective screen.

As it is known, the most common types of microphones for acoustical devices are the so-called "ECM" (Electret and Capacitor Microphone) and "MEMS" (Micro Electrical Mechanical System) microphones.

The second microphone type is a small device for installation in cellular phones and other hand-held acoustical devices, and has a typical size of just 7×4×3 mm.

A MEMS microphone comprises a microphone metal body which is made by the so-called "packaging" assembling process, in which different material layers, also comprising metal materials, are overlapped onto one another in a fully automatic manner.

After having soldered the microphone inner electric circuit components, the microphone thus made is separated from a disposable microphone plate, by cutting through the perimeter of the latter.

By a single cutting operation, a plurality of microphones are cut away.

Before cutting, all the microphones are electrically tested and the rejected ones are automatically separated from the good ones.

The microphones thus made have basic features, the most important of which is their very small size.

The microphone metal body is a good heat conductor.

The above process generates a high heat amount as the microphone inner portion is soldered: accordingly it is necessary to perform a quantitative and qualitative control on 100% of the made microphones at the outlet of the making lines.

As it is also known, the above microphone comprises a plurality of metal pins, typically six, to be soldered to the PCB (i.e. the printed circuit board, or the so-called motherboard), as the final audio device is assembled.

Typical methods for mounting MEMS microphones on a PCB will be disclosed hereinafter.

A MEMS microphone may have a MEMS pattern of a type either mounted on the top or on the bottom, with reference to the mounting position of the microphone on the PCB (either the inner or outer face thereof).

Both the mounting patterns may be used for mass producing acoustical devices, the selection depending on the target final acoustic device architecture.

The microphone opening must be arranged directed toward the sound source, to pick up sound waves for a satisfactory microphone operation.

Depending on the position of the microphone on the PCB or motherboard, the microphone opening may vary.

In fact, for top mounted MEMS, the opening is held on the face of the PCB opposite to the coupling pins to be soldered to the PCB.

On the contrary, for MEMS microphones mounted on the bottom face, the PCB is drilled and the coupling pins are soldered to contacts all arranged about the hole.

Thus, the MEMS opening should be arranged on the same face as that of the coupling pins, i.e. facing the outside sound source.

Accordingly, it should be apparent that the above different positions affect the heat amount flowing to the opening during the pin soldering operations: more specifically, for bottom mounted MEMS, the opening will be arranged nearest to the connecting pins and the heat flow will be a maximum one.

This represents a problem when a protective screen is applied directly at the opening position, as it should be apparent hereinafter.

With respect to the microphone protection, a basic need is that of preventing small particles and water drops from entering the microphone, thereby causing failures and a decay of the acoustical response.

Such a protection may be achieved by a protective screen arranged near the MEMS opening.

Fabric material and porous media screens are generally used as a protective barrier against a penetration of particles.

In the acoustical field, an open mesh fabric material (net) is frequently used.

The mainly used material consists of a fabric comprising synthetic single thread yarns, with a net mesh opening from 20 to 100 microns.

A polyester polymer (PET) is conventionally used.

An example of such a fabric material is the well known "Acoustex B160" fabric, having a 21 micron opening mesh pattern with a density of 190 threads/cm, which is spun from a 31 micron single-thread PET yarn, having an acoustically impedance of 160 MKS Rayls, and made, for example, by the company Saati SpA.

When a protective screen is applied, a typical solution is that of using a die-cut independent portion, made of a woven net with a foam and adhesive material, connected near the opening through the acoustical device outer surface.

Such provision of a separated component prevents the screen from being exposed to the preliminarily soldering operation heat.

In case of a top mounted MEMS, a prior solution is that of applying a die-cut portion to the inner face of the device outer body.

Such a component is constituted of the fabric material protective screen with an addition of a double adhesive ring element and optionally a thin foamed layer operating as a hanger layer.

Since the die-cut portion remains attached to the cellular phone outer body, or other audio device, said die-cut portion provides a good protection.

However, this approach is affected by the serious drawback that it adds an independent component which must be necessarily installed during the device final assembling, thereby increasing the device making time and cost.

Moreover, the MEMS microphone is left unprotected during the intermediate assembling steps, from the printed board soldering step to the plastics material body closing step.

Considering the comparatively high number of defective pieces of conventional MEMS making methods, the lack of such a protection in the mentioned assembling steps is very dangerous.

The bottom mounted MEMS have less exposed openings, which, however, must be protected against fine particle penetrations.

At present, on the printed board opposite face, a die-cut portion consisting of a synthetic protective screen plus an adhesive is applied, which efficiently protects the MEMS opening against a very small particle intrusion.

Such a solution is satisfactory, even if not perfect, since a laterally open space is left; however, it has the same drawback as that of the top mounted MEMS systems, that is an additional die-cut portion assembling step and a lack of microphone intermediate protection during the device assembling operation.

In addition to the above, in the so-called "packaging" and assembling steps, the MEMS microphones are heated at least two times.

MEMS may be also made by other making methods, some of which use the "reflow" process generating a large amount of heat in the microphone body, thereby the microphone body may achieve a critical temperature.

Moreover, temperature data may change depending on the MEMS making method, mainly as said MEMS are soldered to the PCB at either upward or downward directed connection soldering points during the final device assembling operating step.

In this connection it should be moreover pointed out that a MEMS has a very small size and is mainly made of a metal material, which is a further critical condition from a thermal standpoint.

The temperature generated in making a MEMS may have a value of 300° C., which is dangerous for the protecting screen material.

At present, the above protecting screen or barrier is usually made of a polyester (PET, polyethyleneterephtalate), that is a polymer having a melting temperature from 240 to 260° C., thereby a direct exposition to a higher temperature could damage or destroy the synthetic mesh screen.

Thus, for the above reason, the above mentioned die-cut portion is applied near the MEMS, but not therewithin.

The screen application per se is carried out in a second operating step, at the end of all the heating processes, that is after having made the MEMS and soldered it.

This is the main limitation of the prior MEMS making methods, that is a very complex assembling, a lack of protection during the intermediate processing steps and an unsatisfactory and non perfect protection during the use.

As above disclosed, prior approaches are not ideal both for top mounted and bottom mounted MEMS, because of the requirements of assembling an additional component greatly increasing the making cost.

Moreover, the logistic properties are also deteriorated because of the provision of the mentioned additional component to be added and separately handled.

Moreover, it should be further pointed out that the protective screen is applied only when the final acoustical device has been fully assembled, or at least after having soldered the microphone on the PCB, and usually at a different making place of another customer.

Thus, during the making, storing, transporting (if provided) and final PCB circuit soldering, the MEMS are left in an unprotected condition.

A theoretical ideal solution would be that of providing protection to the MEMS per se.

In other words, the protective screen should be made as a single body with the MEMS, thereby in the following assembling steps it would be possible to "forget" the screen presence.

In actual practice, such an idea is impracticable because of temperature limitations.

It would be very advantageous to fully install the protective screen before soldering the microphone in its target position.

This means that the synthetic screen should endure at least the heat generated in the soldering operation, which is a rather critical thing, mainly for bottom mounted MEMS.

In fact, in a bottom mounted MEMS, the microphone opening is facing the PCB very near to the coupling contacts to be soldered to the PCB.

Thus, by considering the minimum distance and high conductibility of these metal portions, the screen melting temperature is undesirably achieved during the soldering operation.

In other words, the bottom mounted pattern is the most sensible to heat at the microphone opening region.

If it is desired to mount the protecting screen near the opening, then the screen must endure the soldering heat.

For a top mounted MEMS, the distance between the coupling pins and the opening is slightly larger and, accordingly, the thermal stress of the soldering operation is smaller than that of the bottom mounted MEMS.

In some favorable conditions, a prior polyester screen is satisfactory from a thermal standpoint.

However, for assuring a proper protective barrier in all the intended applications, it would be desirable to have a material with a larger acceptable temperature threshold.

SUMMARY OF THE INVENTION

Accordingly, the aim of the present invention is to provide a built-in textile material screen for protecting MEMSs adapted to overcome the above disclosed prior art drawbacks.

Within the scope of the above mentioned aim, a main object of the invention is to provide such a textile material screen to be applied directly to the microphone during the MEMS making process, and adapted to protect the MEMS against small particles and water intrusion, while improving the MEMS device acoustical efficiency.

Another object is that providing a textile material screen which may be constructed as a built-in portion of the MEMS device, at the start of the MEMS making process, by designing a dedicated making system, the so-called dedicated "packaging".

A further object of the present invention is to allow a MEMS to be built-in in user devices in a very flexible manner and without the need of adding outer components.

A further object of the present invention is to provide such a textile screen consisting of screen materials having satisfactory and sufficient heat resistance, thereby preventing the MEMS from being damaged during the soldering operations.

According to one aspect of the present invention, the above mentioned aim and objects, as well as further objects which will become more apparent hereinafter, are achieved by a MEMS with a built-in textile material protecting screen, characterized in that said MEMS comprises a microphone body having an opening thereat is arranged a textile material protecting screen which is built-in in the microphone body during the packaging of such MEMS.

BRIEF DESCRIPTION OF THE DRAWINGS

Further characteristics and advantages of the present invention will become more apparent hereinafter from the following detailed disclosure of a preferred, though not exclusive, embodiment of the invention, which is illustrated, by way of an indicative but not limitative example, in the accompanying drawings, where.

DESCRIPTION OF THE PREFERRED EMBODIMENTS

With reference to the number references of the above mentioned figures, the built-in textile material screen, for protecting a MEMS, according to the present invention, generally indicated by the reference number 1, comprises a microphone body 2 having an opening 3 thereat is arranged a single piece textile screen 4, which is built-in in the microphone body 2 during the "packaging" phase of the MEMS device.

Figure 1:
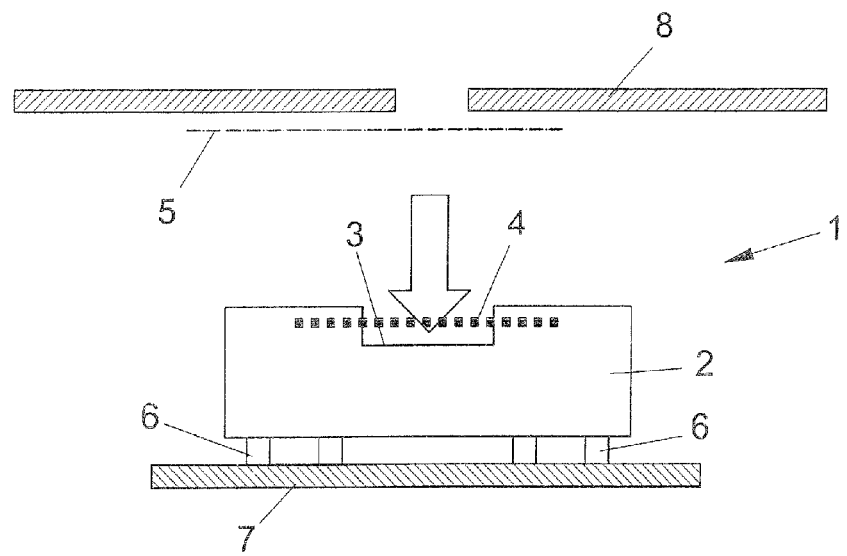
FIG. 1 is a schematic elevation view of a MEMS mounted on a top of a PCB.

FIG. 1 shows an application example of the MEMS at a top position thereof.

More specifically, FIG. 1 shows at the top thereof, by a dash-dot line, the position of a prior protective screen 5, applied as an independent die-cut portion.

On the contrary, the protective screen 4 according to the present invention (indicated by the dashed line in both FIG. 1 and FIG. 2) is associated to the MEMS body and constitutes an integrating part of the latter, as shown at the bottom of FIG. 1 itself.

Accordingly, the microphone and related screen may be processed as an independent component.

The opening 3 is fully protected against extraneous particles, in any of preliminarily storing, soldering and assembling steps of the audio device.

For a top mounting arrangement, in which the opening 3 is spaced from the coupling pins 6 to the PCB 7, the protecting screen 4 consists of either a conventional PET material or an advanced polymer, resisting against high temperatures, such as PEEK, PPS, PTFE, and so on.

The outer shell of the device, for example a cellular phone, has been generally indicated by the reference number 8.

Figure 2:
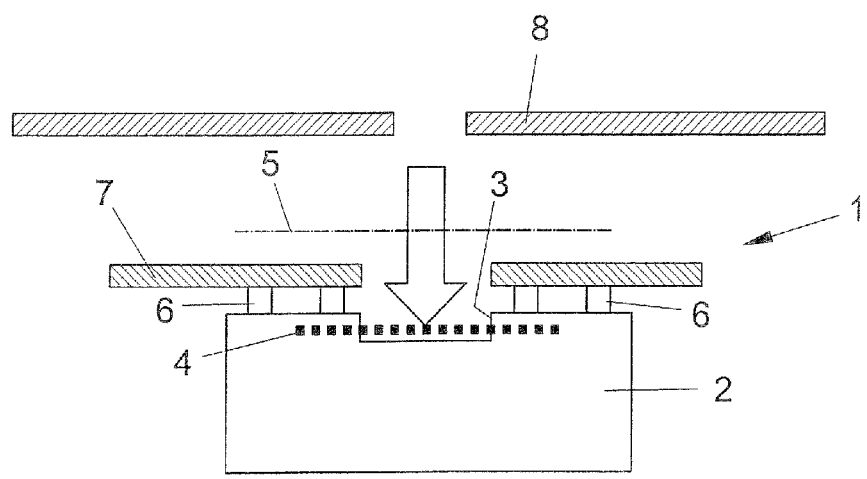
FIG. 2 is a further schematic elevation view of a MEMS mounted on a bottom of a PCB.

FIG. 2 shows an application example of the MEMS 1 at a bottom position.

The dash and dot line 5 shows the position of a conventional screen, consisting of a die-cut adhesive portion clamped or affixed on the outer face of the PCB 7.

On the contrary, according to the present invention, the screen 4 is directly applied to the microphone body 2 at a position near the PCB 7.

This position provides a perfect protection against extraneous small particles and water drops, during all the making operating steps, from the soldering to the end assembling of the acoustical device.

In the above configuration, since the opening 3 is arranged very close to the coupling contacts 6 to be soldered, a very high thermal stress is generated.

This is made possible, according to the present invention, by the use of high temperature resistant polymers for making the protecting screen.

To directly apply the protecting screen 4 to the outer or inner face of the MEMS, it is necessary to operate during the MEMS making process, that is its "packaging".

Even if this process generates heat in some operating steps, the screen 4 would endure this heat.

To this end, as a structural material a polymer, such as PEEK, having a sufficiently high melting temperature for preventing the material from being damaged by the maximum temperature actually achieved in the making method is used.

To endure heat after the soldering operations, the textile screen is made of high melting temperature polymeric materials such as PEEK, PPS, PTFE and the like.

Any polymer having a melting temperature larger than that of PET would be suitable for such an application.

A preferred textile structure is a woven single-thread mesh pattern.

By way of an example, a suitable woven net is made of a PEEK (polyetheretherketone) material having a melting temperature of 343° C., for enduring the MEMS making and soldering operations.

Preferably, such a novel material has a 25 micron mesh size or opening, a 140 mesh/cm pitch, and the PEEK thread or yarn has a 40 micron diameter.

The construction of the textile screen may vary.

It is possible to use the above mentioned polymers, either of a single layer or multiple layer configuration, with different textile textures, having either a single or multi-thread yarn, a density larger than or equal to 100 threads/cm and a thread diameter up to 60 microns.

It has been found that the invention fully achieves the intended aim and objects.

In fact, a built-in textile screen has been made which is directly applied to the microphone body during the MEMS making process, and adapted to protect against small particle and water drop penetration, while improving the MEMS acoustical efficiency.

The screen according to the present invention is made an integrating part of the MEMS device at the start of the making of the latter, by a specifically designed making method, that is the so-called "packaging".

The invention allows to integrate in a very flexible manner the MEMS device, without adding outer components.

In practicing the invention, the used materials, as well as the contingent size and shapes can be any, depending on requirements.

The invention claimed is:

1. A MEMS microphone device with a built-in single piece protecting screen, said MEMS microphone device being adapted to be soldered to a PCB having a top surface and a bottom surface, and being soldered either to said top surface or said bottom surface of said PCB, said microphone device comprising a microphone body having an opening on which said protecting screen is arranged, wherein said protecting screen is directly applied to said microphone body in a MEMS making process to become integral with said microphone body and wherein said protecting screen consists of a textile protective structure made of a woven monofilament or multifilament yarn mesh configuration with a density larger than or equal to 100 threads/cm and a thread diameter up to 60 microns.

2. A MEMS microphone device, according to claim 1, wherein said textile structure is made of a textile polymeric thread material selected from PEEK, PTFE, PPS, PET, PA, PP threads and any polymer thread having a melting temperature sufficiently high enough to prevent damaging the MEMS device when soldering said MEMS device to said PCB.

3. A MEMS microphone device, according to claim 2, wherein said textile polymeric tread material has a 25 micron mesh size and a 140 mesh/cm pitch.

4. A MEMS microphone device, according to claim 2, wherein said textile polymeric thread material comprises PEEK threads having melting temperature of 343° C. and a 40 micron thread diameter.

5. A MEMS microphone device, according to claim 1, wherein said MEMS microphone device is soldered to said top surface of said PCB.

6. A MEMS microphone device, according to claim 1, wherein said MEMS microphone device is soldered to said bottom surface of said PCB.

* * * * *